(12) United States Patent
Kim

(10) Patent No.: US 8,120,062 B2
(45) Date of Patent: *Feb. 21, 2012

(54) COMPLEMENTARY METAL OXIDE SEMICONDUCTOR IMAGE SENSOR AND METHOD FOR FABRICATING THE SAME

(75) Inventor: Sang-Young Kim, Chungcheongbuk-do (KR)

(73) Assignee: Intellectual Ventures II LLC, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/606,845

(22) Filed: Oct. 27, 2009

(65) Prior Publication Data

US 2010/0044764 A1   Feb. 25, 2010

Related U.S. Application Data

(63) Continuation of application No. 11/303,059, filed on Dec. 13, 2005, now Pat. No. 7,608,872.

(30) Foreign Application Priority Data

Sep. 14, 2005  (KR) .............................. 2005-0085676

(51) Int. Cl.
*H01L 31/0328* (2006.01)

(52) U.S. Cl. ........ 257/184; 257/187; 257/572; 257/291; 257/E31.058

(58) Field of Classification Search .................. 257/184, 257/187, 257, 291
See application file for complete search history.

(56) References Cited

U.S. PATENT DOCUMENTS

| | | | |
|---|---|---|---|
| 6,032,197 A | 2/2000 | Birdwell et al. | |
| 6,385,199 B2 | 5/2002 | Yoshimura et al. | |
| 6,542,931 B1 | 4/2003 | Le et al. | |
| 6,707,819 B1 | 3/2004 | Fraser et al. | |
| 6,711,164 B1 | 3/2004 | Le et al. | |
| 6,751,209 B1 | 6/2004 | Hamiti et al. | |
| 6,857,095 B2 | 2/2005 | Suumaki et al. | |
| 6,967,964 B1 | 11/2005 | Svanbro et al. | |
| 7,266,105 B2 | 9/2007 | Wu | |
| 7,286,536 B2 | 10/2007 | Greis et al. | |

(Continued)

FOREIGN PATENT DOCUMENTS

EP   1137237   9/2001

(Continued)

OTHER PUBLICATIONS

Degermark, M.; "IP Header Compression"; Network Working Group, Lulea University of Technology/SICS; IETF Standards; Internet Engineering Task Force, Feb. 1999 (XP 015008290).

(Continued)

*Primary Examiner* — Wai Sing Louie

(74) *Attorney, Agent, or Firm* — McAndrews, Held & Malloy, Ltd.

(57) ABSTRACT

A complementary metal oxide semiconductor (CMOS) device and a method for fabricating the same are provided. The CMOS image sensor includes: a first conductive type substrate including a trench; a channel stop layer formed by using a first conductive type epitaxial layer over an inner surface of the trench; a device isolation layer formed on the channel stop layer to fill the trench; a second conductive type photodiode formed in a portion of the substrate in one side of the channel stop layer; and a transfer gate structure formed on the substrate adjacent to the photodiode to transfer photoelectrons generated from the photodiode.

29 Claims, 4 Drawing Sheets

U.S. PATENT DOCUMENTS

| | | | |
|---|---|---|---|
| 7,394,807 | B2 | 7/2008 | Hamiti et al. |
| 7,608,872 | B2 * | 10/2009 | Kim .............................. 257/291 |
| 2001/0007137 | A1 | 7/2001 | Suumaki et al. |
| 2002/0044552 | A1 | 4/2002 | Vialen et al. |
| 2002/0064164 | A1 | 5/2002 | Barany et al. |
| 2002/0071432 | A1 | 6/2002 | Soderberg et al. |
| 2003/0061557 | A1 | 3/2003 | Chao et al. |
| 2003/0137931 | A1 | 7/2003 | Hans et al. |
| 2004/0042491 | A1 | 3/2004 | Sarkkinen et al. |
| 2005/0253214 | A1 * | 11/2005 | Nagasaki et al. ............. 257/462 |
| 2006/0027844 | A1 * | 2/2006 | Jung .............................. 257/291 |

FOREIGN PATENT DOCUMENTS

| | | |
|---|---|---|
| EP | 1146713 | 10/2001 |
| JP | 63114438 | 5/1988 |
| JP | 63-257244 | 10/1988 |
| JP | 04-304655 | 10/1992 |
| JP | 63248254 | 10/1998 |
| JP | 2001-196573 | 7/2001 |
| JP | 2001320422 | 11/2001 |
| JP | 2002026963 | 1/2002 |
| JP | 2004-247647 | 9/2004 |
| JP | 2005-093555 | 4/2005 |
| JP | 2005-197682 | 7/2005 |
| JP | 2006-287117 | 10/2006 |
| WO | 0049748 | 8/2000 |
| WO | 0072486 | 11/2000 |
| WO | 0167709 | 9/2001 |

OTHER PUBLICATIONS

ETSI TS 125 323 v3.6.0 (Sep. 2001); Universal Mobile Telecommunications Systems (UMTS); Packet Data Convergence Protocol (PDCP) Specification (3GPP TS 25.323 v 3.6.0 Release 1999) (XP 014008762).

Degermark, M., et al.; "Low-Loss TCP/IP Header Compression for Wireless Networks"; ACM, US. vol. 3, No. 5, Oct. 1997, pp. 375-387 (XP 000728935).

Torkelsson, Kjell, et al.; "Header Compression in Handel-C—an Inetrnet Application and a New Design Langauge"; Euromicro Symposium on Digital Systems, Design, Proceedings 2001, pp. 2-7.

Hayden, M. et al.; "Optimizing Layered Communications Protocols"; The Sixth IEEE International Symposium on High Performance Distributed Computing, Proceedings; Aug. 8, 1997, pp. 169-177.

European Search Report.
International Search Report dated Jan. 15, 2003.
European Search Report dated Aug. 6, 2008.
Japanese Office Action dated Apr. 25, 2008.
Russian Office Action dated Oct. 26, 2007.

* cited by examiner

COMPLEMENTARY METAL OXIDE SEMICONDUCTOR IMAGE SENSOR AND METHOD FOR FABRICATING THE SAME

CROSS-REFERENCE TO RELATED APPLICATIONS/INCORPORATION BY REFERENCE

The present application is a CONTINUATION of U.S. application Ser. No. 11/303,059, filed Dec. 13, 2005 which claims priority to KR Application 2005-0085676, filed Sep. 14, 2005. The Applicant expressly hereby incorporates by reference each of the above identified applications herein in their entirety.

FIELD OF THE INVENTION

The present invention relates to an image sensor; and more particularly, to a complementary metal oxide semiconductor (CMOS) image sensor and a method for fabricating the same.

DESCRIPTION OF RELATED ARTS

Complementary metal oxide semiconductor (CMOS) devices have been widely used in mobile phones, cameras for personal computers and electronic appliances. The CMOS image sensors provide a simple operation method compared to charge coupled devices (CCD) which have been conventionally used as image sensors. Signal processing circuits can be integrated in one chip through using the CMOS image sensors. Thus, it is possible to embody a system on chip, thereby obtaining minimization of a module.

Furthermore, the CMOS image sensors have a lot of advantages including reducing production costs since the CMOS image sensors can use a set-up technology with compatibility.

FIG. 1 is a cross-sectional view illustrating a portion of a unit pixel of a conventional CMOS image sensor.

As shown in FIG. 1, a device isolation layer 12 is locally formed in a lower structure formed by stacking a highly doped $P^{++}$-type substrate 10 and a lowly doped $P^-$-type epitaxial layer (not shown). Hereinafter, the lower structure is referred as a semiconductor structure. A gate pattern 18 including a stack structure of a gate insulation layer 14 and a gate conductive layer 16 on the semiconductor structure, and a plurality of spacers 19 on both sidewalls of the gate pattern 18 form a transfer gate structure 20.

Also, a plurality of highly doped $P^+$-type impurity regions 24 and 25, each serving a role as a $P^0$-type impurity and as a channel stop layer respectively, and a lowly doped $N^-$-type photodiode 21 are formed in a portion of the semiconductor structure aligned with one side of the transfer gate structure 20 through an ion-implantation process and a heat diffusion process. A highly doped $N^+$-type floating diffusion region 22 is formed in a portion of the semiconductor structure aligned with the other side of the transfer gate structure 20.

At this time, the device isolation layer 12 serves a role in preventing an electron movement between neighboring pixels, i.e., a crosstalk event. Recently, to surely prevent the crosstalk event, a trench is formed deeply. However, if the trench is formed with a depth of several micrometers, it is possible to prevent electrons generated from a deep portion of the semiconductor structure from moving to the neighboring pixels; however, there may be a limitation that sidewalls of the trench deeply formed (hereinafter, referred to as a deep trench) cannot be all doped. Accordingly, a depletion layer of the photodiode 21 expands to the sidewalls of the deep trench and thus, a dark current may increase.

SUMMARY OF THE INVENTION

It is, therefore, an object of the present invention to a complementary metal oxide semiconductor (CMOS) image sensor capable of preventing a crosstalk event and a flow of dark current and a method for fabricating the same.

In accordance with one aspect of the present invention, there is provided a complementary metal oxide semiconductor (CMOS) image sensor, including: a first conductive type substrate including a trench; a channel stop layer formed by using a first conductive type epitaxial layer over an inner surface of the trench; a device isolation layer formed on the channel stop layer to fill the trench; a second conductive type photodiode formed in a portion of the substrate in one side of the channel stop layer; and a transfer gate structure formed on the substrate adjacent to the photodiode to transfer photo-electrons generated from the photodiode.

In accordance with another aspect of the present invention, there is provided a CMOS image sensor, including: a first conductive type substrate including a trench; a channel stop layer formed by using a first conductive type epitaxial layer to fill the trench; a second conductive type photodiode formed in a portion of the substrate in one side of the channel stop layer; and a transfer gate structure formed on the substrate adjacent to the photodiode to transfer photo-electrons generated from the photodiode.

In accordance with further aspect of the present invention, there is provided a method for fabricating a CMOS image sensor, including: preparing a first conductive type substrate including a trench; forming a first conductive type channel stop layer over an inner surface of the trench by performing an epitaxy process; forming a device isolation layer on the channel stop layer to fill the trench; forming a gate pattern for a transfer gate structure on the substrate in one side of the channel stop layer; forming spacers on sidewalls of the gate pattern; and forming a second conductive type photodiode in a portion of the substrate between the trench and the gate pattern by performing an ion-implantation process.

In accordance with still further aspect of the present invention, there is provided a method for fabricating a CMOS image sensor, including: preparing a first conductive type substrate including a trench; forming a first conductive type channel stop layer to fill the trench by performing an epitaxy process; forming a gate pattern for a transfer gate structure on the substrate in one side of the channel stop layer; forming spacers on sidewalls of the gate pattern; and forming a second conductive type photodiode in a portion of the substrate between the trench and the gate pattern by performing an ion-implantation process.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Figure 1:
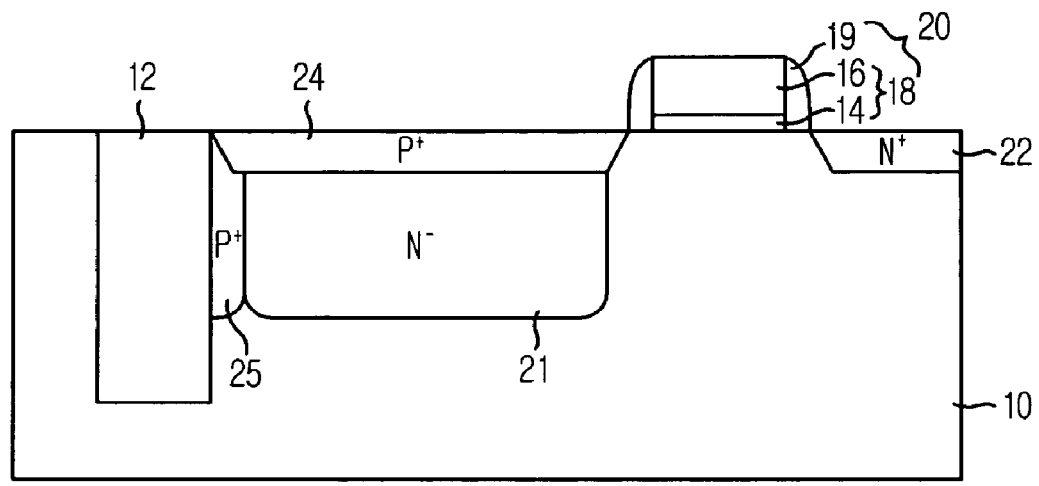
FIG. 1 is a cross-sectional view illustrating a portion of a unit pixel of a conventional complementary metal oxide semiconductor (CMOS) image sensor.

Hereinafter, detailed descriptions on preferred embodiments of the present invention will be provided with reference to the accompanying drawings.

Also, it should be noted that thicknesses of layers and regions are overstated to clearly define the layers and the regions in the specification. If it is written that a layer is formed on another layer or a substrate, the layer can be formed on said another layer or the substrate directly, or a third layer can be interposed between layers. Furthermore, the same reference numerals indicate the same constitution elements throughout the specification.

Figure 2:
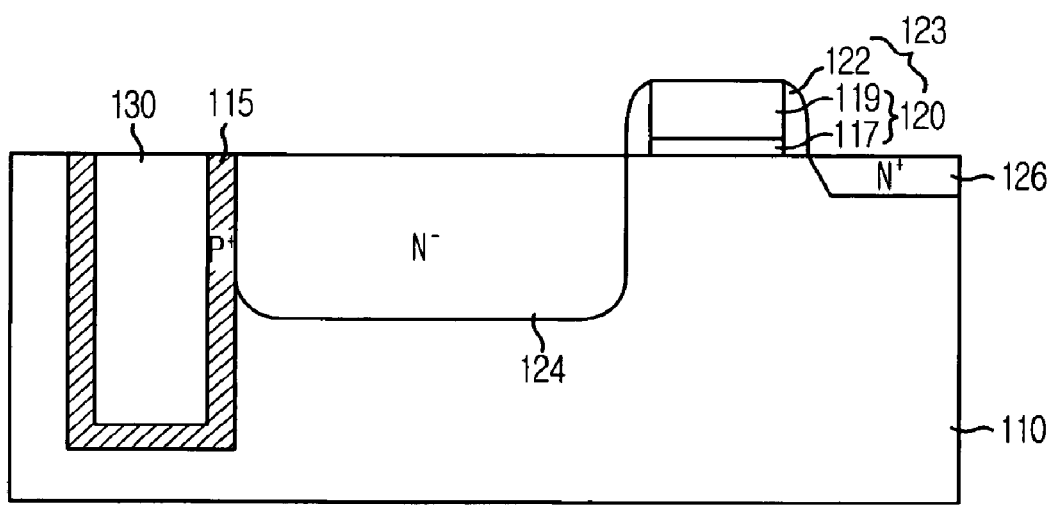
FIG. 2 is a cross-sectional view illustrating a portion of a unit pixel of a CMOS image sensor in accordance with a first embodiment of the present invention.

FIG. 2 is a cross-sectional view illustrating a portion of a unit pixel of a CMOS image sensor in accordance with a first embodiment of the present invention.

Referring to FIG. 2, the unit pixel of the CMOS image sensor in accordance with the first embodiment of the present invention includes: a highly doped $P^{++}$-type substrate 110 provided with a deep trench (not shown); a channel stop layer 115 formed by using a highly doped $P^+$-type epitaxial layer over an inner surface of the deep trench; a device isolation layer 130 formed on the channel stop layer 115 to fill the deep trench; a lowly doped $N^-$-type photodiode 124 formed in a portion of the substrate 110 in one side of the channel stop layer 115; and a transfer gate structure 123 formed on the substrate 110 closed to the photodiode 124 to transfer photoelectrons generated from the photodiode 124. Furthermore, the unit pixel of the CMOS image sensor further includes a floating diffusion region 126 formed in a portion of the substrate 110 adjacent to the transfer gate structure 123 and opposite to the photodiode 124.

At this time, the transfer gate structure 123 includes a gate pattern 120 formed by using a gate insulation layer 117 and a gate conductive layer 119, and a plurality of spacers 122 formed on both sidewalls of the gate pattern 120. Particularly, the gate conductive layer 119 is formed by using one selected from the group consisting of polysilicon, tungsten silicide and a stack layer thereof. The plurality of spacers 122 are formed by using a nitride layer, an oxide layer or an oxynitride layer.

Although not shown, a highly doped $P^+$-type epitaxial layer is stacked on the highly concentrated $P^+$-type substrate 110. At this time, the substrate 110 is a single crystal silicon layer.

That is, in accordance with the first embodiment of the present invention, the epitaxial grown channel stop layer 115 is formed by being doped in a conductive type which is opposite to that of the photodiode 124 over the inner surface of the deep trench. Thus, it is possible to form the uniform channel stop layer 115 although a line width of the trench is narrow and a depth of the trench is deep. Accordingly, it is possible to prevent not only a crosstalk event of the CMOS image sensor from being generated but also dark current from flowing.

Figure 3A:
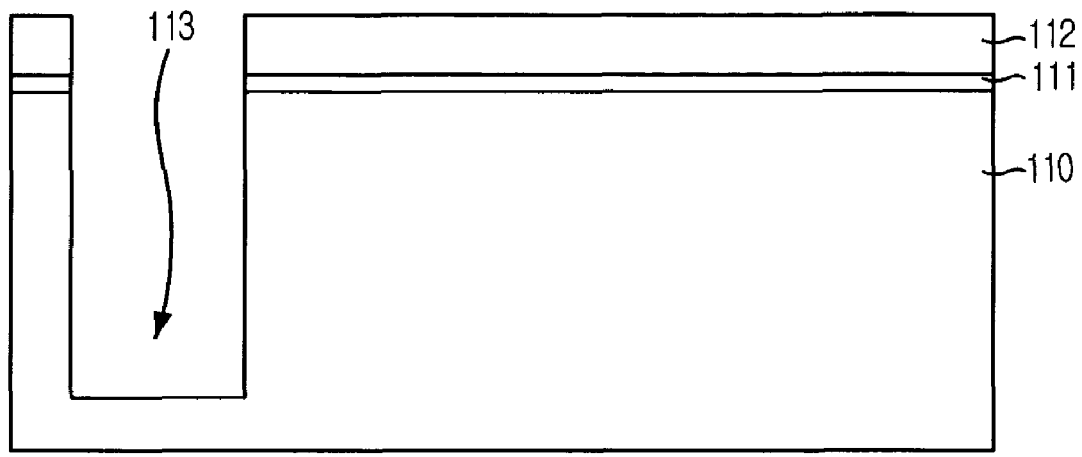
FIGS. 3A to 3C are cross-sectional views illustrating a method for fabricating the CMOS image sensor shown in FIG. 2.
Figure 3B:
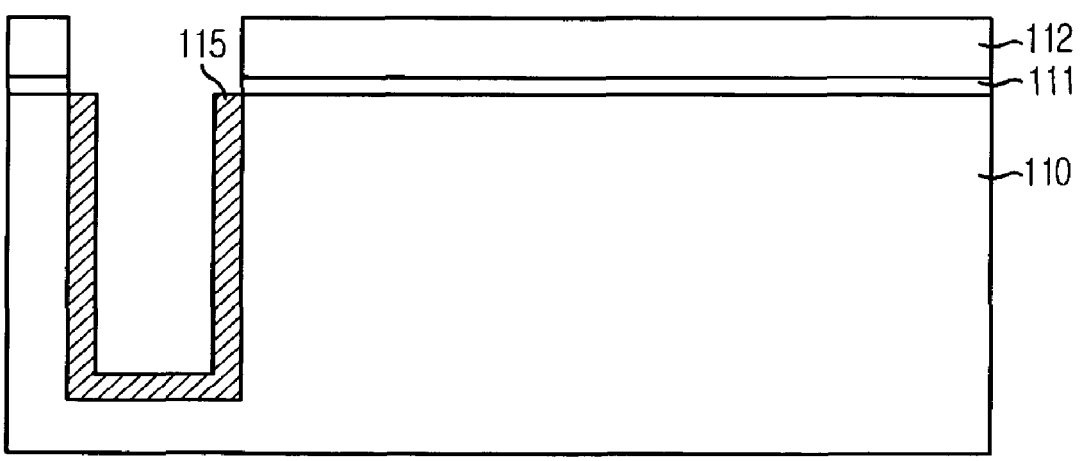
Figure 3C:
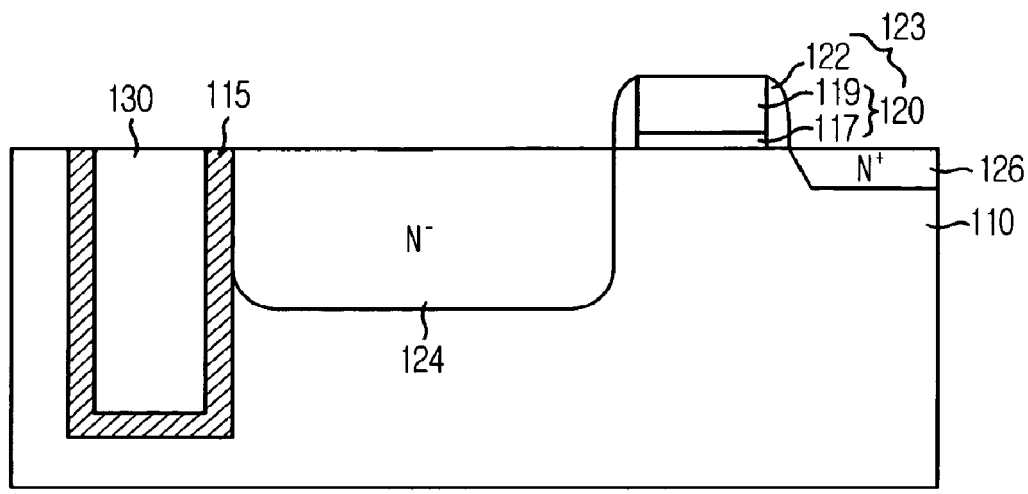

FIGS. 3A to 3C are cross-sectional views illustrating a method for fabricating the CMOS image sensor in accordance with the first embodiment of the present invention shown in FIG. 2.

First, as shown in FIG. 3A, a pad oxide layer 111 and a pad nitride layer 112 are deposited on a highly doped $P^{++}$-type substrate 110. At this time, a lowly doped $P^-$-type epitaxial layer (not shown) is formed on an upper portion of the substrate 110.

Next, a deep trench isolation (DTI) etching process is performed, thereby deeply forming a trench, i.e., a deep trench, in the substrate 110. For instance, a mask process and an etching process are employed and then, a predetermined mask pattern (not shown) is formed on the pad nitride layer 112. Afterwards, an etching process is performed by using the mask pattern, thereby etching predetermined portions of the pad nitride layer 112, the pad oxide layer 111 and the substrate 110. Hence, the aforementioned deep trench 113 is formed in a portion of the substrate 110. Afterwards, the mask pattern is removed through a strip process.

At this time, a device isolation is performed through a typical shallow trench isolation (STI) process in remaining portions except the unit pixel.

Next, as shown in FIG. 3B, an epitaxy process is performed by using an in-situ method, thereby growing the highly doped $P^+$-type channel stop layer 115 over an inner surface of the deep trench 113. At this time, a first conductive type impurity diffusion region can be formed on the substrate in which the photodiode is formed (hereinafter, referred to as a photodiode region). For instance, the pad nitride layer 112 and the pad oxide layer 111 exiting on the photodiode region are etched and afterwards, the epitaxy process is performed, thereby forming the channel stop layer 115 on the substrate 110 of the photodiode region.

Next, as shown in FIG. 3C, the pad nitride layer 112 and the pad oxide layer 111 are removed through a wet etching process.

Next, a high density plasma (HDP) oxide layer is deposited on the channel oxide layer 115 to fill the deep trench. Afterwards, the deposited HDP oxide layer is planarized and thus, a device isolation layer 130 is formed. At this time, the device isolation layer 130 is formed in a predetermined height from a lower portion of the deep trench 113 to prevent a gate conductive layer 119 which will be deposited through a substrate process from remaining inside the trench 113.

Next, a gate insulation layer 117 is formed on an entire layer including the device isolation layer 130 and afterwards, the aforementioned gate conductive layer 119 is formed on the gate insulation layer 117. In more detail, a gate oxide layer is formed through an oxidation process and afterwards, a conductive material such as polysilicon is deposited through a chemical vapor deposition (CVD) method.

Next, predetermined portions of the gate conductive layer 119 and the gate insulation layer 117 are etched, thereby forming a gate pattern 120 for a transfer gate structure 123 on the substrate 110. Afterwards, a plurality of spacers 122 formed by using an insulation layer are formed on both sidewalls of the gate pattern 120.

Next, an ion-implantation process is employed by using a predetermined mask pattern, thereby forming a photodiode 124 in a portion of the substrate 110 between the channel stop layer 115 and the gate pattern 120. For instance, the lowly doped $N^-$-type photodiode 124 is formed by implanting an N-type impurity such as phosphorous (P) or arsenic (As).

Next, a floating diffusion region 126 is formed in a portion of the substrate 110 adjacent to the gate pattern 120 and opposite to the photodiode 124 by performing an ion-implantation process.

Figure 4:
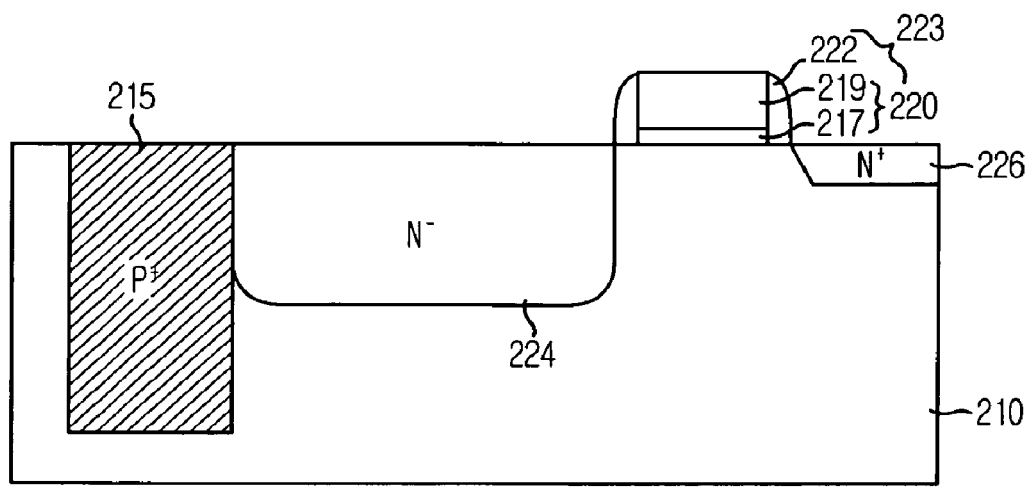
FIG. 4 is a cross-sectional view illustrating a portion of a unit pixel of a CMOS image sensor in accordance with a second embodiment of the present invention.

FIG. 4 is a cross-sectional view illustrating a portion of a unit pixel of a CMOS image sensor in accordance with a second embodiment of the present invention.

Referring to FIG. 4, the unit pixel of the CMOS image sensor in accordance with the second embodiment of the present invention includes: a highly doped $P^{++}$-type substrate 210 provided with a trench (not shown); a channel stop layer 215 formed by using a highly doped $P^+$-type epitaxial layer to fill the trench; a lowly doped $N^-$-type photodiode 224 formed in a portion of the substrate 210 in one side of the channel stop layer 215; and a transfer gate structure 223 formed on the substrate 210 closed to the photodiode 224 to transfer photo-electrons generated from the photodiode 224. Furthermore, the unit pixel of the CMOS image sensor further includes a floating diffusion region 226 formed in a portion of the substrate 210 adjacent to the transfer gate structure 223 and opposite to the photodiode 224.

That is, compared with the first embodiment of the present invention which the channel stop layer 115 is formed over the inner surface of the trench, the channel stop layer 215 is formed by filling the entire trench in accordance with the second embodiment of the present invention. Accordingly, since an additional process for forming a device isolation layer is not necessary, it is possible to simplify a CMOS image sensor fabrication process.

Figure 5A:
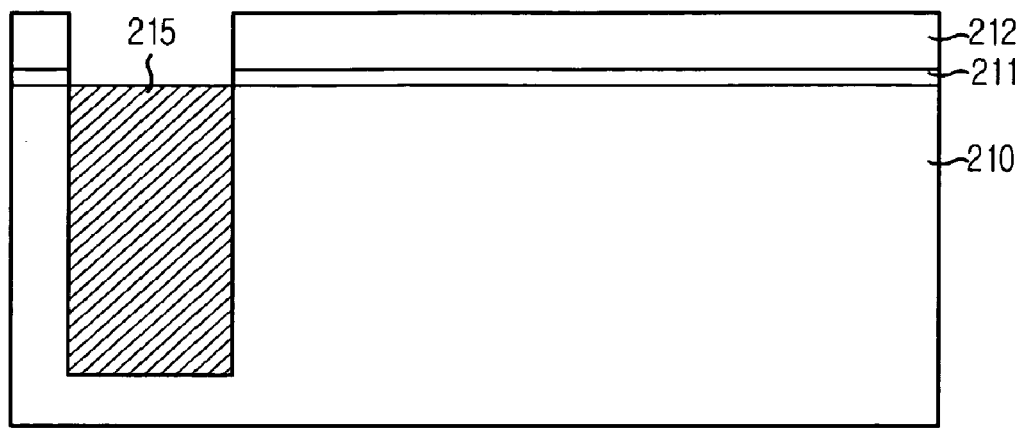
FIGS. 5A to 5B are cross-sectional views illustrating a method for fabricating the CMOS image sensor shown in FIG. 4.
Figure 5B:
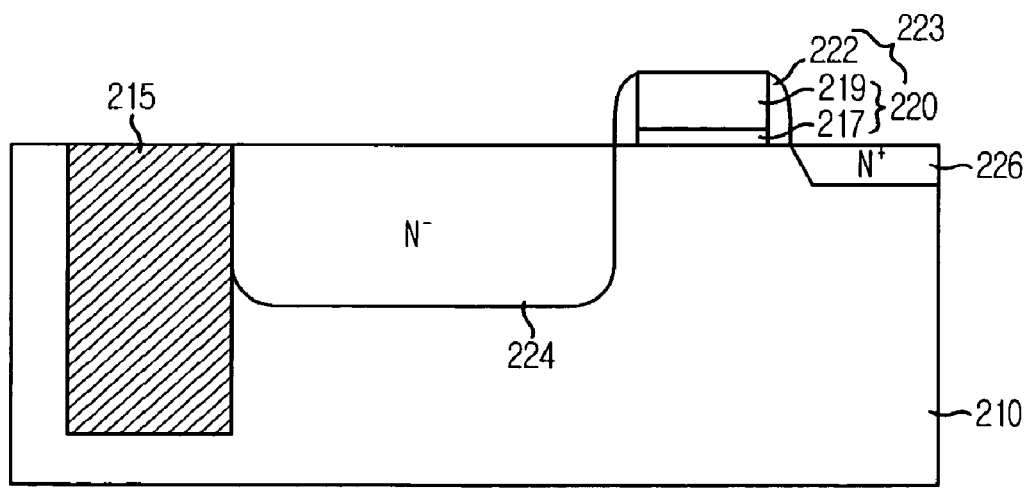

FIGS. 5A and 5B are cross-sectional views illustrating a method for fabricating the CMOS image sensor in accordance with the second embodiment of the present invention shown in FIG. 4.

First, as shown in FIG. 5A, similar to the first embodiment of the present invention, a highly doped $P^+$-type substrate 210 including a deep trench (not shown) is provided. For instance, predetermined portions of a pad oxide layer 211 and a pad nitride layer 212 formed on the substrate 210 are etched, thereby forming a deep trench in the substrate 210.

Next, as shown in FIG. 5B, an epitaxy process is performed by using an in-situ method and thus, a highly doped $P^+$-type channel stop layer 215 is grown until the deep trench (not shown) is filled.

Next, a wet etching process is performed, thereby removing the pad nitride layer 212 and the pad oxide layer 211.

Next, a transfer gate structure 223 is formed through the method used in the first embodiment of the present invention. Afterwards, an ion-implantation process is employed, thereby forming a photodiode 224 in a portion of the substrate 210 between the transfer gate structure 223 and the channel stop layer 215. In more detail, a lowly doped $N^-$-type ion is implanted and thus, the lowly doped $N^-$-type photodiode 224 is formed. Herein, the transfer gate structure 223 includes a gate pattern 200 formed in a stack structure of a gate insulation layer 217 and a gate conductive layer 219, and a plurality of spacers 222 formed on both sidewalls of the gate pattern 220.

Next, an ion-implantation process is performed and then, a floating diffusion region 226 is formed in a portion of the substrate 210 adjacent to the transfer gate structure 223 an opposite to the photodiode 224. Preferably, a highly doped $N^+$-type impurity is implanted, thereby forming the highly doped $N^+$-type floating diffusion region 226.

On the basis of the present invention, a deep trench is formed in a substrate and then, an epitaxial grown channel stop layer is formed over an inner surface of the deep trench. Thus, it is possible to form the uniform channel stop layer on sidewalls of the deep trench. Accordingly, it is possible to prevent not only a crosstalk event but also a flow of dark current. Hence, efficiency of CMOS image sensors is greatly improved.

The present application contains subject matter related to the Korean patent application No. KR 2005-0085676, filed in the Korean Patent Office on Sep. 14, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. An image sensor, comprising:
  a substrate including a trench that extends down from a surface of the substrate to a first depth;
  an epitaxial channel stop layer formed over an inner surface of the trench;
  a transfer gate structure on the substrate; and
  a photodiode positioned between the trench and the transfer gate structure;
  wherein the photodiode extends down from the surface of the substrate to a second depth that is less than the first depth.

2. The image sensor of claim 1, wherein the epitaxial channel stop layer is further formed over a region of the substrate associated with the photodiode.

3. The image sensor of claim 1, further comprising:
  a device isolation layer formed on the epitaxial channel stop layer.

4. The image sensor of claim 3, wherein the device isolation layer fills the trench.

5. The image sensor of claim 1, further comprising:
  a floating diffusion region in a portion of the substrate opposite to the photodiode and adjacent to the transfer gate structure.

6. An image sensor, comprising:
  a substrate including a trench filled with an epitaxial layer;
  a photodiode configured to generate photo-electrons;
  a floating diffusion layer configured to receive photo-electrons; and
  a transfer gate structure configured to control a transfer of photo-electrons from the photodiode to the floating diffusion layer, wherein:
    the photodiode is positioned between the trench and the transfer gate structure; and
    the transfer gate structure is positioned between the photodiode and the floating diffusion layer.

7. The image sensor of claim 6, wherein:
  the photodiode comprises material of a first conductive type; and
  the epitaxial layer comprises material of a second conductive type that is opposite to the material of the first conductive type.

8. The image sensor of claim 6, wherein:
  the photodiode is an N-type photodiode; and
  the epitaxial layer is a P-type epitaxial layer.

9. The image sensor of claim 6, wherein the trench extends deeper into the substrate than the photodiode.

10. The image sensor of claim 6, further comprising:
  a shallow isolation trench;
  wherein the trench extends deeper into the substrate than the shallow isolation trench.

11. An image sensor, comprising:
a substrate including a deep trench having a first depth and a shallow isolation trench having a second depth that is less than the first depth;
a transfer gate structure on the substrate;
a photodiode positioned between the deep trench and the transfer gate structure; and
a floating diffusion region positioned opposite the photodiode and adjacent to the transfer gate structure;
wherein the transfer gate structure is configured to control a transfer of photo-electrons from the photodiode to the floating diffusion region in response to a transfer gate signal; and
wherein an inner surface of the trench is covered with an epitaxial material of a conductive type that is opposite to that of the photodiode.

12. The image sensor of claim 11, wherein the inner surface covered with the epitaxial material corresponds to an inner surface of the deep trench adjacent to the photodiode.

13. The image sensor of claim 11, wherein all inner surfaces of the deep trench are covered with the epitaxial material of the conductive type that is opposite to that of the photodiode.

14. The image sensor of claim 11, wherein the deep trench is filled with the epitaxial material of the conductive type that is opposite to that of the photodiode.

15. The image sensor of claim 11, further comprising:
a device isolation layer formed over the epitaxial material of the conductive type that is opposite to that of the photodiode;
wherein the device isolation layer fills the deep trench.

16. An electronic device, comprising:
an image sensor including:
a substrate;
a trench formed in the substrate;
an epitaxial channel stop layer formed over an inner surface of the trench;
a transfer gate structure on the substrate;
a photodiode positioned between the trench and the transfer gate structure; and
a floating diffusion region positioned opposite the photodiode and adjacent to the transfer gate structure; and
signal processing circuitry coupled to the image sensor;
wherein the transfer gate structure is configured to control a transfer of photo-electrons from the photodiode to the floating diffusion region.

17. The electronic device of claim 16, wherein the electronic device is a mobile phone.

18. The electronic device of claim 16, wherein the electronic device is a camera.

19. The electronic device of claim 16, wherein the epitaxial channel stop layer fills the trench.

20. The electronic device of claim 16, further comprising:
a device isolation layer formed on the epitaxial channel stop layer.

21. The electronic device of claim 16, further comprising:
a device isolation layer formed on the epitaxial channel stop layer;
wherein the device isolation layer fills the trench.

22. The electronic device of claim 16, wherein the epitaxial channel stop layer comprises material of a conductive type that is opposite to that of the photodiode.

23. The electronic device of claim 16, wherein the trench extends deeper into the substrate than the photodiode.

24. The electronic device of claim 16, further comprising:
a shallow isolation trench;
wherein the trench extends deeper into the substrate than the shallow isolation trench.

25. An integrated circuit, comprising:
signal processing circuitry and an image sensor integrated in one chip;
wherein the image sensor includes:
a substrate;
a trench formed in the substrate;
a transfer gate structure on the substrate;
a photodiode positioned between the trench and the transfer gate structure;
a floating diffusion region positioned opposite the photodiode and adjacent to the transfer gate structure; and
an epitaxial layer formed over an inner surface of the trench and positioned adjacent to the photodiode.

26. The integrated circuit of claim 25, wherein the epitaxial layer comprises material of a conductive type that is opposite to that of the photodiode.

27. The integrated circuit of claim 25, wherein the epitaxial layer fills the trench with material of a conductive type that is opposite to that of the photodiode.

28. The integrated circuit of claim 25, further comprising:
a device isolation layer formed over the epitaxial layer;
wherein the device isolation layer fills the trench.

29. The integrated circuit of claim 25, wherein the trench extends deeper into the substrate than the photodiode.

* * * * *

UNITED STATES PATENT AND TRADEMARK OFFICE
CERTIFICATE OF CORRECTION

PATENT NO.        : 8,120,062 B2
APPLICATION NO.   : 12/606845
DATED             : February 21, 2012
INVENTOR(S)       : Kim It is certified that error appears in the above-identified patent and that said Letters Patent is hereby corrected as shown below:

Title Page, item (56), under "U.S. Patent Documents", in Column 2, Line 1,
delete "6,032,197 A 2/2000 Birdwell et al." and
insert -- 6,032,197 A 2/2000 Birdwell et al.
6,274,907 B1 8/2001 Nakagawa
6,372,603 B1 4/2002 Yaung et al.
6,358,818 B1 3/2002 Shye-Lin Wu --.

Title Page, item (56), under "U.S. Patent Documents", in Column 2, Line 7,
delete "6,857,095 B2 2/2005 Suumaki et al." and
insert -- 6,857,095 B2 2/2005 Suumaki et al.
6,888,214 B2 5/2005 Mouli et al. --.

Page 2, item (56), under "U.S. Patent Documents", in Column 1, Line 9,
delete "2004/0042491 A1 3/2004 Sarkkinen et al." and
insert -- 2004/0042491 A1 3/2004 Sarkkinen et al.
2004/0185595 A1 9/2004 Lee
2005/0139943 A1 6/2005 Kanbe
2005/0156213 A1 7/2005 Han et al.
2005/0176167 A1 8/2005 Won-Ho Lee --.

Page 2, item (56), under "U.S. Patent Documents", in Column 1, Line 11,
delete "2006/0027844 A1* 2/2006 Jung ........... 257/291" and
insert -- 2006/0027844 A1* 2/2006 Jung ........... 257/291
2006/0138470 A1 6/2006 Han
2007/0045679 A1 3/2007 McKee et al. --.

Page 2, item (56), under "Foreign Patent Documents", in Column 1, Line 12,
delete "JP 2006-287117 10/2006" and insert -- JP 2006-287117 10/2006
JP 11-087684 3/1999

Signed and Sealed this
Twenty-third Day of October, 2012

David J. Kappos
*Director of the United States Patent and Trademark Office*

CERTIFICATE OF CORRECTION (continued)
U.S. Pat. No. 8,120,062 B2

KR 1020010009810 2/2001
KR 1020020055120 7/2002
KR 20030000134 1/2003
KR 1020040058754 7/2004
KR 1020040059429 7/2004
KR 1020040065328 7/2004 --.

Page 2, item (56), under "Other Publications", in Column 2, Line 9, delete "Inetrnet Application and a New Design Langauge";" and insert -- Internet Application and a New Design Language"; --.